United States Patent [19]

Shepherd

[11] Patent Number: 4,936,012
[45] Date of Patent: Jun. 26, 1990

[54] TERMINAL POSITIONING ASSEMBLY AND METHODS

[75] Inventor: Brian Shepherd, Wendover, England

[73] Assignee: Smiths Industries Public Limited Company, London, England

[21] Appl. No.: 416,623

[22] Filed: Oct. 3, 1989

[30] Foreign Application Priority Data

Oct. 13, 1988 [GB] United Kingdom ............... 8824023

[51] Int. Cl.⁵ .................. H01R 9/14; B65D 73; B65D 02
[52] U.S. Cl. ................... 29/845; 206/328; 206/329; 29/739; 439/751; 439/590
[58] Field of Search ............... 206/328/329; 439/433, 439/434, 444, 590, 741, 751; 29/739, 450, 845

[56] References Cited

U.S. PATENT DOCUMENTS

| 3,545,606 | 12/1970 | Bennett et al. | 29/739 X |
| 4,442,938 | 4/1984 | Murphy | 206/328 X |
| 4,506,438 | 3/1985 | Ammon et al. | 29/739 |
| 4,615,927 | 10/1986 | Holzmann | 206/328 X |
| 4,787,510 | 11/1988 | Powell | 206/329 |

FOREIGN PATENT DOCUMENTS 1478215 6/1977 United Kingdom .
2144390 3/1985 United Kingdom .
2218279 11/1989 United Kingdom .

Primary Examiner—Carl E. Hall
Assistant Examiner—C. J. Arbes
Attorney, Agent, or Firm—Pollock, Vande Sande and Priddy

[57] ABSTRACT

Electrical sockets are positioned for insertion in holes in a circuit board by means of a sheet of a bendable plastics having an array of apertures in some of which the sockets are inserted. Each socket has a knurled region around its upper end just below a flange. The flange is undercut to give it a sloping lower surface and a peripheral edge that bites into the upper surface of the sheet. Ultrasonic energy is used to cause the sheet material around the sockets to flow into close contact with the terminals. The assembly of the sheet and sockets is used to insert the sockets in the circuit board following which they are soldered in place and the sheet is removed by pulling back from one edge over the sockets.

10 Claims, 2 Drawing Sheets

TERMINAL POSITIONING ASSEMBLY AND METHODS

BACKGROUND OF THE INVENTION

This invention relates to terminal positioning assemblies and methods.

When mounting several socket terminals or the like on a circuit board, it is common practice first to mount the terminals in a carrier, in the required configuration, so that all the terminals can be mounted on the circuit board at the same time. The carrier can take the form of a substantially rigid plastics block or it may be in the form of a flexible sheet, such as described in U.S. Pat. Nos. 4,506,438, 3,545,606, 4,099,615 or 4,442,938. Ideally, the carrier should be sufficiently flexible to enable it to be peeled away from the terminals after insertion, yet the assembly should retain its terminals sufficiently securely to position them accurately on the circuit board and to ensure that they do not become separated from the carrier during packaging and transport.

BRIEF SUMMARY OF THE INVENTION

It is an object of the present invention to provide a terminal positioning assembly and method which can provide secure retention of the terminals.

According to one aspect of the present invention there is provided a terminal positioning assembly comprising an electrically-insulative bendable sheet having an array of a plurality of apertures therethrough, and a plurality of electrical terminals located in respective ones of the apertures, each terminal having a knurled surface comprising longitudinally extending surface formations around a part at least of its perimeter, said knurled surface being arranged to enable the terminal to be pushed into the respective aperture in the sheet and to resist rotation of the terminal relative to the sheet, and a radially projecting member towards one end of the knurled surface, the radially projecting member engaging one side of the sheet around the aperture to resist longitudinal movement of the terminal in one direction.

The radially projecting member is preferably a flange with a surface formation arranged to bite into the one side of the sheet.

The surface formation on the flange may be formed by a peripheral edge of an undercut sloping surface. The terminal may be of circular section along the major part of its length and may be an electrical socket. The sheet is preferably of a plastics material and the terminal may be bonded to the sheet by flow of sheet material onto the terminal. The apertures in the sheet may be in an orthogonal array and only some of the apertures of the array may contain a terminal.

According to another aspect of the present invention there is provided a method of positioning terminals on a circuit board including the steps of forming through an electrically-insulative bendable sheet an array of a plurality of apertures some at least of which are in the desired configuration of the terminals on the circuit board, providing a plurality of electrical terminals each having a knurled surface comprising longitudinally extending surface formations around a part at least of its perimeter and a radially projecting member towards one end of the knurled surface, inserting each terminal in a respective aperture so that the knurled surface engages the edge of the aperture and resists rotation of the terminal relative to the sheet and so that the radially projecting member engages one side of the sheet to resist longitudinal movement of the terminal in one direction, positioning the sheet with the terminals in their respective apertures so that the terminals align with respective apertures in a circuit board, inserting the terminals in the apertures in the circuit board, and securing the terminals in the apertures in the circuit board.

Energy, such as ultrasonic energy, may be applied to cause the sheet material around the terminals to flow into close contact with the terminals after insertion of the terminals in the apertures in the sheet. The method may include the step of subsequently removing the sheet by pulling back from one edge over the terminals.

A terminal positioning assembly and method in accordance with the present invention, will now be described, by way of example, with reference to the accompanying drawings.

DETAILED DESCRIPTION OF PREFERRED EMBODIMENT

Figure 1:
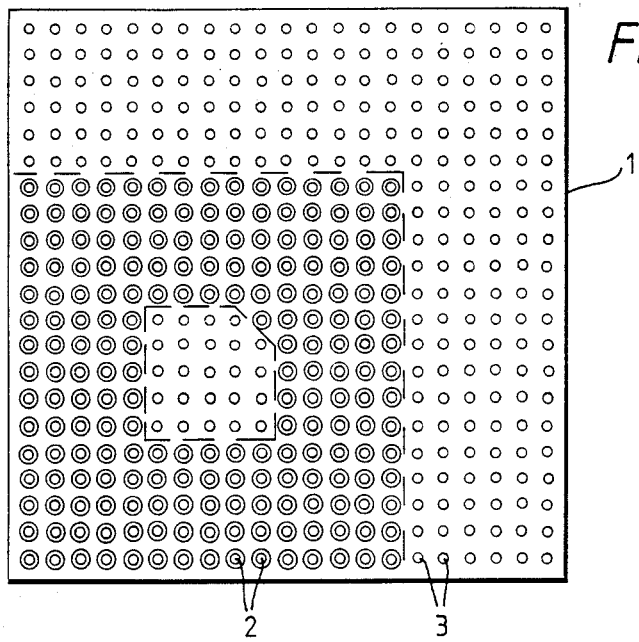
FIG. 1 is a plan view of the assembly.
Figure 2:
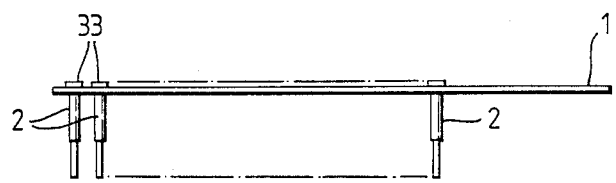
FIG. 2 is a side elevation view of the assembly.

With reference first to FIGS. 1 and 2, the assembly comprises a bendable sheet 1 of polyester plastics and two hundred electrical socket terminals 2 located in apertures 3 in the sheet.

The sheet 1 is 0.175 mm thick and is square in shape with sides about 53 mm long. The apertures 3 are formed over the entire surface of the sheet in an orthogonal array of apertures with a pitch of about 2.5 mm arranged with twenty one apertures in each of twenty one rows. The sheet can be used for many different configurations of sockets. In the present example, as shown, only those apertures in the lower left corner of the sheet contain sockets and the central region of this corner is also unoccupied by sockets. In other configurations, the sheet could be cut or stamped to remove the unused areas or to provide windows. The window shape could be non-symmetrical so as to provide orientation of the assembly.

Figure 3:
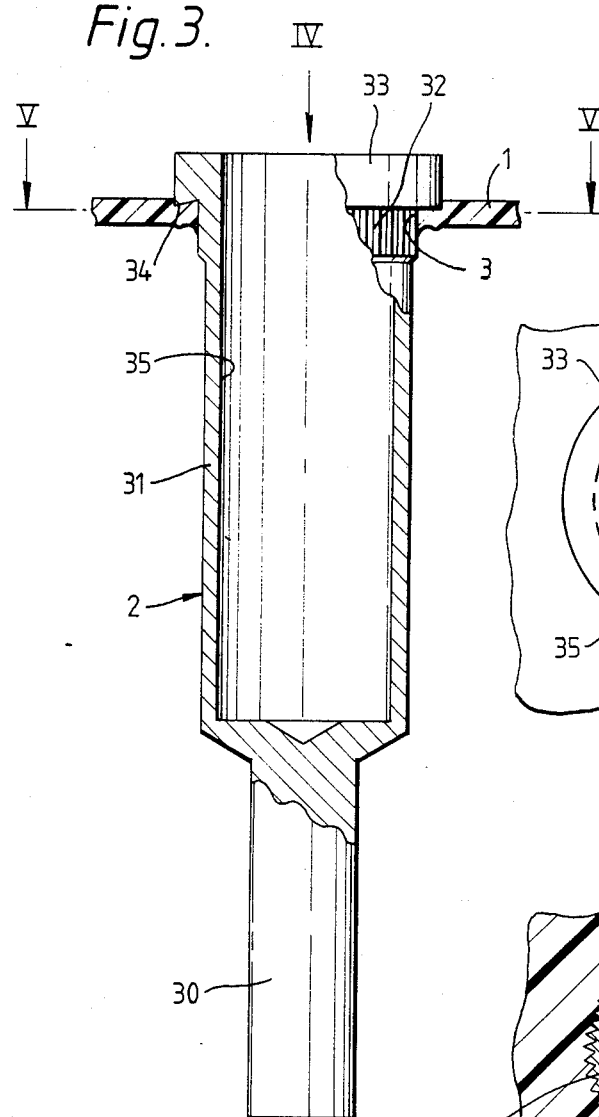
FIG. 3 is a cross-sectional elevation of a part of the assembly to an enlarged scale.
Figure 4:
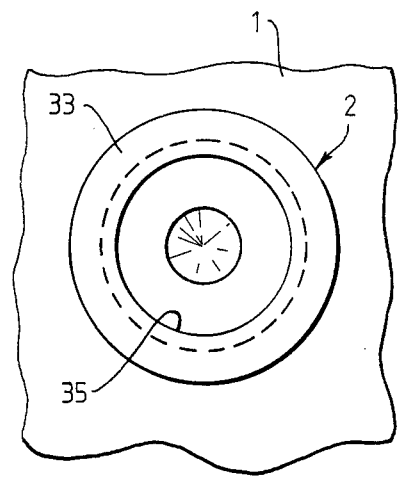
FIG. 4 is a plan view of a part of the assembly to an enlarged scale and along the arrow IV of FIG. 3.
Figure 5:
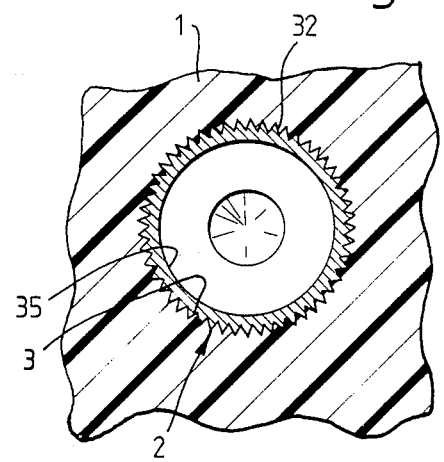
FIG. 5 is a cross section along the line V-13 V of FIG. 3.

With reference now to FIGS. 3 to 5, each socket terminal 2 is of substantially cylindrical shape and is machined from brass piece parts, being about 7 mm long and of circular section. The lower part 30 of the terminal is solid, being about 0.7 mm in diameter and provides a pin portion of the terminal which is inserted in a circuit board. The upper part 31 of the terminal is hollow having an outer diameter of about 1.4 mm and an inner diameter of about 1.2 mm aiong the major part of its length. The upper part 31 is open at its upper end and is about 4.5 mm long. An external knurled region 32 is formed close to the upper end of the terminal, just below a radially projecting flange 33. The knurled region 32 extends around the entire periphery of the terminal and is formed by longitudinally extending projecting ridges which gives the terminal in the knurled region 32 an external diameter of 1.52 mm, the length of the knurled region being 0.4 mm.

The flange 33 has a diameter of 1.85 mm and a height at its outer edge of 0.3 mm. The flange 33 is undercut at an angle in its lower surface to give it a sloping surface and to form a biting, peripheral lower edge 34.

In the bore 35 of the upper part 31 of the socket terminal may be located any conventional female electrical contact, such as, for example, of the kind described in UK Patent Specification No. 863764 and sold under the Registered Trade Mark Hypertac. These contacts contain several resilient wires arranged obliquely of the axis of the socket so that a male contact inserted within it makes a sliding contact with the wires.

Each aperture 3 in the sheet 1 is of circular shape and 1.44 mm in diameter, that is, slightly larger than the external diameter of the major portion of the upper part 31 of the terminal 2 but smaller than the diameter of the knurled portion 32.

The socket terminals 2 are assembled in the apertures 3 in the sheet 1 by pushing the lower end 30 of each terminal through a respective aperture until the lower end of the knurled region 32 contacts the edge of the aperture. Additional force is then applied to push the terminal down so that the knurled region 32 deforms the edge of the aperture 3, and the lower edge 34 contacts the upper surface of the sheet and is pressed downwardly to bite into its surface. Ultrasonic energy is applied in the region of the edge of the aperture 3 as the terminal is pushed down so as to cause heating and softening of the sheet material around the apertures thereby enabling it to flow into close contact with the surface of the terminal 2 and form a good bond with the terminal.

After insertion of the terminals 2 in the required configuration, the assembly is complete and can then be used to mount the terminals in a circuit board. In this form, the terminals 2 are securely retained and accurately positioned by the carrier sheet close to the point of entry of a male contact into the socket terminals. The knurled surface 32, the undercut edge 34 of the flange and the ultrasonic bond together hold the terminals 2 against longitudinal and rotational displacement relative to the sheet 1. This enables the assembly to be mounted on the circuit board with the terminals 2 supported during soldering. It also enables the assembly to be packed and transported with a reduced risk of any terminal falling out of the sheet. This is a particular advantage in complex assemblies with many terminals where a missing terminal may not be immediately apparent.

Figure 6:
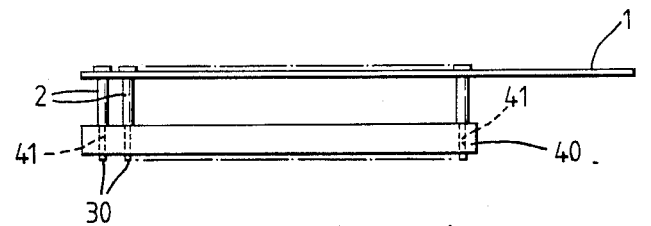
FIG. 6 is a side elevation view illustrating a step in use of the assembly.
Figure 7:
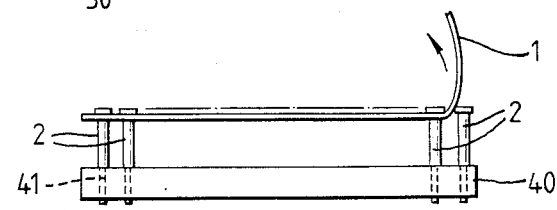
FIG. 7 illustrates a subsequent step in assembly to that shown in FIG. 6.

The terminals 2 are transferred to a circuit board 40 in the manner shown in FIGS. 6 and 7. The assembly is first placed on the circuit board 40, as show in FIG. 6, with the lower ends 30 of the terminals 2 positioned by the carrier sheet 1 in register with respective holes 41 in the circuit board. The assembly is then lowered so that the lower ends 30 of the terminals project into the holes 41. With the sheet 1 still in place, the terminals are soldered into the holes 41 by any conventional process. Subsequently, the sheet can be removed in the manner shown in FIG. 7 by pulling one edge up and back across the assembly. The flexible and resilient nature of the sheet 1 enables the apertures 3 to be deformed sufficiently so that they can be pulled over the flanges 33 without damage to the terminals or the solder joints with the circuit board 40.

In some cases it may be preferred to leave the sheet 1 in place after soldering; this is possible because of its electrically-insulative nature.

The biting edge 34 of the flange 33 helps in the separation of the sheet 1 from the terminals 2. The size of the flange 33 and the angle of the edge 34 can be chosen to give the desired ease of separation.

Some terminals are pushed further into the circuit board than described above, so as to produce a low profile on the upper surface of the board. Using the present invention, the terminals can be pushed into enlarged apertures in a circuit board as far as the knurled surface 32. The secur fit between the sheet and the terminals, by virtue of the knuckling and the undercut surface 34, is particularly advantageous in preventing solder migrating through the apertures 3 in the sheet.

Other forms of terminals, male or female, could be used with the present invention, such as wire-wrap terminations or surface-mounted terminals.

The sheet may be of any size or shape and the apertures in the sheet could be non-circular to receive non-circular terminals.

The sheet could be made of different materials such as, for example, polyimide or a laminate of polyimide with flurocarbon resins.

High temperature resistant materials such as Kapton (a trade mark of DuPont) can be used. A Kapton sheet could be coated with a layer of polytetrafluoroethylene on its upper surface to form the bond with the flange 33.

If the sheet is made from a transparent material it enables the solder joints to be inspected prior to removal of the sheet. Larger sheets would generally be of a thicker or more rigid material to reduce the risk that any flexing of the sheet causes distortion of the positional accuracy. Alternatively, separate or integral stiffening members in the form of bars or frames could be added.

What I claim is:

1. A terminal positioning assembly comprising: an electrically-insulative bendable sheet, said sheet having an array of a plurality of apertures therethrough; and a plurality of electrical terminals, said terminals being located in respective ones of the apertures, each said terminal having a knurled surface comprising longitudinally extending surface formations around a part at least of its perimeter, said knurled surface being arranged to enable the terminal to be pushed into the respective aperture in the sheet and to resist rotation of the terminal relative to the sheet, and a radially projecting member towards one end of the knurled surface, the radially projecting member engaging one side of the sheet around the aperture to resist longitudinal movement of the terminal in one direction.

2. An assembly according to claim 1, wherein the radially projecting member is a flange with a surface formation arranged to bite into the said one side of the sheet.

3. An assembly according to claim 2, wherein the said surface formation on the flange is formed by a peripheral edge of an undercut sloping surface.

4. An assembly according to claim 1, wherein the terminal is an electrical socket.

5. An assembly according to claim 1, wherein the sheet is of a plastics material and the terminal is bonded to the sheet by flow of sheet material onto the terminal.

6. A terminal positioning assembly comprising: a sheet of an electrically-insulative bendable plastics, said sheet having a plurality of apertures therethrough, said apertures being arranged in an array; and a plurality of electrical terminals, said terminals being located in respective ones of the apertures, each said terminal being of circular section along a major part of its length and having a knurled surface comprising longitudinally extending surface formations around a part at least of its perimeter, said knurled surface being arranged to enable the terminal to be pushed into the respective aperture in the sheet and to resist rotation of the terminal relative to the sheet, and a radially projecting flange, said flange having a peripheral edge with an undercut sloping surface that bites into one side of the sheet.

7. A method of positioning terminals on a circuit board including the steps of: providing an electrically-insulative bendable sheet; forming through said sheet an array of a plurality of apertures, some at least of said apertures being in the desired configuration of the terminals on the circuit board; providing a plurality of electrical terminals each having a knurled surface comprising longitudinally extending surface formations around a part at least of its perimeter and a radially projecting member towards one end of the knurled surface; inserting each said terminal in a respective aperture so that the knurled surface engages the edge of the aperture and resists rotation of the terminal relative to the sheet and so that the radially projecting member engages one side of the sheet to resist longitudinal movement of the terminal in one direction; providing a circuit board, said circuit board having apertures therein for receiving said terminals; positioning the sheet with the terminals in their respective apertures so that the terminals align with respective apertures in the circuit board; inserting the terminals in the apertures in the circuit board; and securing the the terminals in the apertures in the circuit board.

8. A method according to claim 7, wherein energy is applied to cause sheet material around the terminals to flow into close contact with the terminals after insertion of the terminals in the apertures in the sheet.

9. A method according to claim 8, wherein the energy is ultrasonic energy.

10. A method according to claim 7 including the step of subsequently removing the sheet by pulling back from an edge over the terminals.

* * * * *